(12) United States Patent
Contet et al.

(10) Patent No.: US 11,898,880 B2
(45) Date of Patent: Feb. 13, 2024

(54) METHOD FOR MANUFACTURING A SENSOR FOR A MOTOR VEHICLE

(71) Applicant: Continental Automotive GmbH, Hannover (DE)

(72) Inventors: Hervé Contet, Toulouse (FR); Martin Throm, Toulouse (FR)

(73) Assignee: Continental Automotive GmbH

( * ) Notice: Subject to any disclaimer, the term of this patent is extended or adjusted under 35 U.S.C. 154(b) by 0 days.

(21) Appl. No.: 17/889,874

(22) Filed: Aug. 17, 2022

(65) Prior Publication Data

US 2023/0058446 A1   Feb. 23, 2023

(51) Int. Cl.
| | |
|---|---|
| *H01L 23/31* | (2006.01) |
| *G01D 11/24* | (2006.01) |
| *G01P 1/02* | (2006.01) |
| *G01P 3/44* | (2006.01) |
| *H01L 23/495* | (2006.01) |

(52) U.S. Cl.
CPC ............. *G01D 11/245* (2013.01); *G01P 1/026* (2013.01); *G01P 3/44* (2013.01); *H01L 23/31* (2013.01); *H01L 23/495* (2013.01)

(58) Field of Classification Search
CPC ........ H01L 23/31; H01L 23/495; G01P 1/026; G01D 11/245
See application file for complete search history.

(56) References Cited

U.S. PATENT DOCUMENTS

| | | | |
|---|---|---|---|
| 2011/0179889 A1 | 7/2011 | De Volder et al. | |
| 2013/0175733 A1* | 7/2013 | De Volder | .......... B29C 45/1671 264/272.15 |
| 2016/0297122 A1 | 10/2016 | Fischer et al. | |

FOREIGN PATENT DOCUMENTS

| | | |
|---|---|---|
| DE | 102008064047 A1 | 4/2010 |
| DE | 102014208425 A1 | 5/2015 |

OTHER PUBLICATIONS

French Search Report and Written Opinion for French Application No. 2108745, dated Apr. 5, 2022, with English translation, 10 pages.

\* cited by examiner

*Primary Examiner* — Jamel E Williams
(74) *Attorney, Agent, or Firm* — RatnerPrestia

(57) ABSTRACT

A method for manufacturing a sensor for a motor vehicle. The method includes placing a sensor core in a lower indentation of a mold; the sensor core having a metal lead frame, including connection pins and lateral retention members, and an integrated circuit, including at least one measurement cell and being overmolded on a support zone of the metal lead frame so the lateral retention members and the connection pins are exposed, and an electrically conductive terminal on each connection pin; placing a magnet in line with the overmolded integrated circuit; placing two lateral indentations of the mold on either side of the magnet and the integrated circuit so the lateral indentations retain the lead frame in the vicinity of the lateral retention members; overmolding the integrated circuit, the magnet and part of the lead frame to allow the free end of the terminals to project; and removing the mold.

10 Claims, 8 Drawing Sheets

METHOD FOR MANUFACTURING A SENSOR FOR A MOTOR VEHICLE

CROSS REFERENCE TO RELATED APPLICATIONS

This application claims priority to French Patent Application No. 2108745, filed Aug. 18, 2021, the contents of such application being incorporated by reference herein.

FIELD OF THE INVENTION

The present invention relates to the field of sensors for a motor vehicle and more specifically to a sensor and a method for manufacturing such a sensor. In particular, the aim of the invention is to improve the accuracy of existing sensors.

BACKGROUND OF THE INVENTION

In a known manner, a motor vehicle comprises a plurality of measurement sensors for measuring, for example, the speed of rotation or the angular position of a drive shaft such as a crankshaft or a camshaft.

Again in a known manner, these sensors operate in association with a target fixed on the shaft, for which a parameter is to be measured. The target is, for example, in the form of a toothed wheel, the teeth of which vary an electromagnetic field generated by a magnet mounted in the sensor. The magnetic field variations are detected by sensitive elements, called measurement cells, of the sensor.

According to a known manufacturing method, the sensor is manufactured in several steps. Firstly, an integrated circuit is overmolded on a metal lead frame comprising pins with an epoxy resin, then the assembly is positioned in a mold and a magnet is positioned on the integrated circuit. The assembly is overmolded, while only allowing the pins to project. Final overmolding is carried out in order to seal the sensor, while forming an electrical connection socket and a sensor attachment member.

In the existing methods, the second overmolding causes the magnet to be positioned relative to the overmolding of the integrated circuit and therefore to the measurement cells, which varies from one sensor to another, which implies a variation in the chain of dimensions within a quite high tolerance range. As a result, the signals generated by the measurement cells for the same target arrangement for a given measurement configuration are different from one sensor to another, which can particularly lead to inaccurate measurements.

Therefore, a requirement exists for a solution for at least partly overcoming these disadvantages.

SUMMARY OF THE INVENTION

To this end, an aspect of the invention is a method for manufacturing a sensor for a motor vehicle, said method comprising the steps of:
  placing a sensor core in a lower indentation of a mold, said sensor core comprising a metal lead frame, comprising a plurality of connection pins and two lateral retention members, and an integrated circuit, comprising at least one measurement cell and being overmolded on a support zone of the metal lead frame so that the lateral retention members and the connection pins are exposed;
  placing an electrically conductive terminal on each connection pin;
  placing a magnet in line with the overmolded integrated circuit;
  placing two lateral mold indentations on either side of the magnet and the integrated circuit so that said lateral indentations retain the lead frame in the vicinity of the lateral retention members by ensuring both longitudinal and transverse translational locking of the lead frame, while forming a space around the integrated circuit and the magnet for an overmolding material;
  overmolding the integrated circuit, the magnet and part of the lead frame so as to allow the free end of the terminals to project;
  removing the mold.

By retaining both the lateral retention members and the magnet, the lateral indentations allow the magnet to be locked relative to the integrated circuit, and therefore to the measurement cells, during overmolding. A very small clearance can exist between the mold indentations and the magnet, but the lateral indentations particularly allow the clearance to be removed between the lead frame and the mold, both longitudinally and transversely, which eliminates a tolerance compared to the previous solutions. As a result, the signals generated by the measurement cells for a given measurement configuration are very close or even identical from one sensor to another, which leads to high accuracy of the measurements.

According to one aspect of the invention, the free end of each lateral retention member comprises at least one stop, preferably with two rounded corners, and with the lateral indentations each comprising two support protrusions, the placement of the two lateral mold indentations involves bringing the at least one stop of the lateral retention member into contact with the protrusions of the corresponding lateral indentation. This bringing into contact generates effective translational locking of the lead frame both longitudinally and transversely by bringing (or by interfering) the protrusions of the lateral indentations into contact with the lateral retention members, in particular in the vicinity of the two corners. The advantage of the corners (or of any other equivalent means with a small surface area) lies in the fact that they allow, due to their small surface area, both the lead frame to be retained while allowing almost complete overmolding of the integrated circuit and the magnet.

According to another aspect of the invention, placing the magnet in the lower indentation of the mold is carried out so that the magnet comes into abutment against said lower indentation of the mold along the longitudinal axis. This placement allows the magnet to be pre-centred in the mold before positioning the lateral mold indentations.

Advantageously, the method further comprises a step of placing a pin allowing the magnet to be vertically translationally locked in the mold.

More advantageously, the method further comprises a step of placing a pin allowing the magnet to be longitudinally translationally locked in the mold.

According to one aspect of the invention, the method further comprises a step of disposing the integrated circuit on the metal lead frame and a step of overmolding the integrated circuit and part of the lead frame so as to expose the lateral retention members and to allow the end of the connection pins to project, with the magnet then being placed on said overmolding of the integrated circuit.

According to one aspect of the invention, the method comprises a step of electrically connecting the integrated circuit with the connection pins.

According to one aspect of the invention, the method comprises a step of final overmolding of the overmolding of the integrated circuit, the magnet and part of the lead frame so as to form a connector socket around the ends of the connection pins.

An aspect of the invention also relates to a mold for manufacturing a sensor using the method as set forth above, said sensor comprising a metal lead frame comprising a plurality of connection pins and two lateral retention members, each lateral retention member comprising a free retention end comprises at least one stop, preferably two corners, said mold comprising two lateral indentations each comprising an inner support surface having a section, preferably in the form of a V, designed to retain the lead frame in the vicinity of the at least one stop of the free end of the lateral retention members of the lead frame, by ensuring longitudinal and transverse translational locking of the lead frame when the mold is closed onto the lead frame placed in the mold.

An aspect of the invention also relates to a motor vehicle comprising a sensor obtained using the method as set forth above.

BRIEF DESCRIPTION OF THE DRAWINGS

Further features and advantages of aspects of the invention will become more apparent from reading the following description. This description is purely illustrative and should be read with reference to the appended drawings, in which.

DETAILED DESCRIPTION OF THE PREFERRED EMBODIMENTS

The sensor obtained using the method according to an aspect of the invention is intended to be mounted in a motor vehicle. The sensor can be of any type. For example, the sensor can be a position or speed sensor of a drive shaft such as a crankshaft or camshaft or any other suitable shaft.

Figure 12:
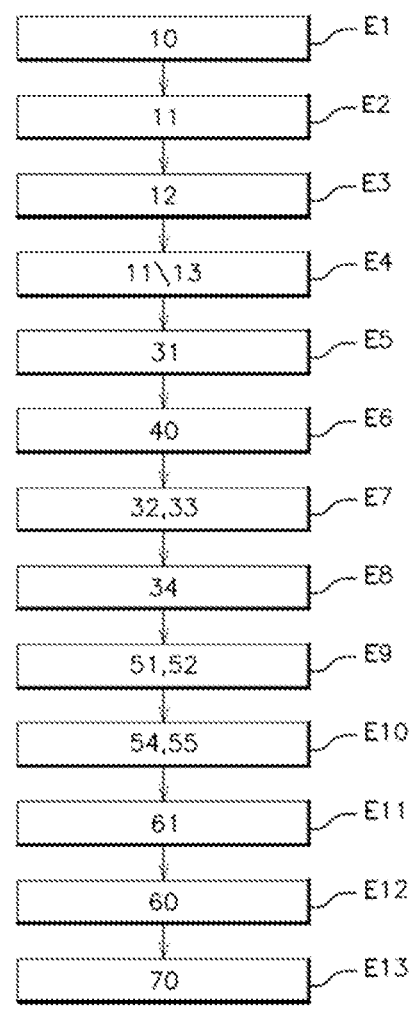
FIG. 12 schematically illustrates an embodiment of the method according to the invention.

FIGS. 1 to 11 show an embodiment of the sensor 1 according to the invention at different steps of the manufacturing method and FIG. 12 shows an embodiment of the method according to the invention.

Figure 1:
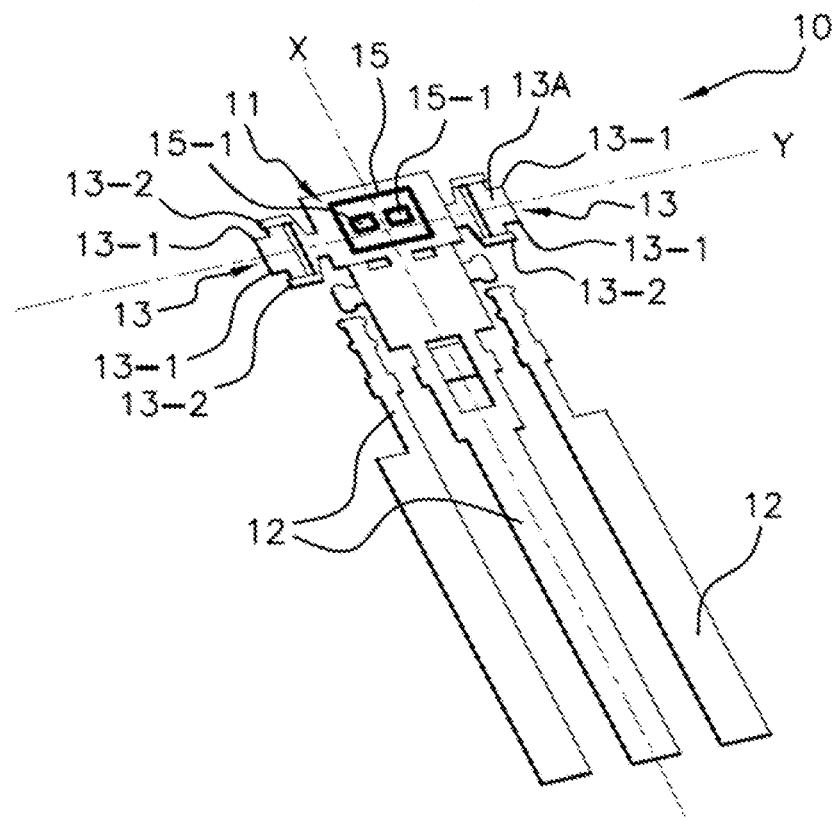
FIG. 1 is a perspective view of a lead frame of one embodiment of the sensor according to the invention.

Firstly, as illustrated in FIG. 1, a metal lead frame 10 is disposed on a support (not shown for the sake of clarity) in a step E1.

The lead frame 10 is in the form of a metal part comprising a support zone 11, from which a plurality of connection pins 12 extends, along a longitudinal axis X, for electrically connecting the measurement cells 15-1 of an integrated circuit 15 to an external computer (not shown), in a manner per se known. In this example, the lead frame 10 comprises three connection pins 12.

The support zone 11 of the lead frame 10 comprises two lateral retention members 13, integrally formed with the support zone 11 and extending along a transverse axis Y, perpendicular to the longitudinal axis X.

The integrated circuit 15 comprising the measurement cells 15-1 is disposed on the support zone 11 in a step E2, and then the integrated circuit is electrically connected with the connection pins 12, for example, by means of metal wires soldered between each connection pin 12 and three connection terminals of the integrated circuit in a step E3.

Figure 2:
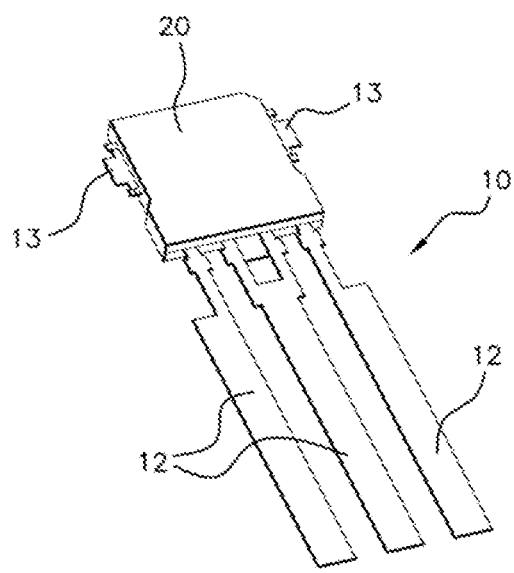
FIG. 2 is a perspective view of the lead frame of FIG. 1 provided with an integrated circuit overmolding.
Figure 3:
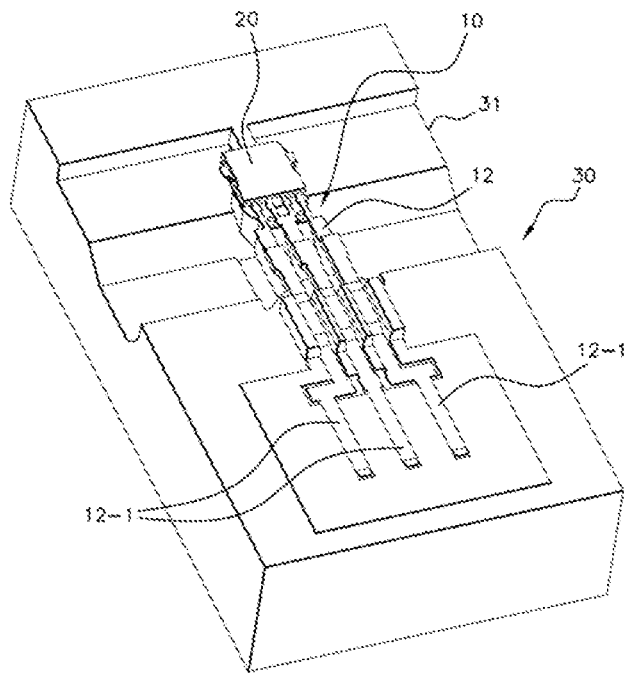
FIG. 3 is a perspective view of the assembly of FIG. 2 positioned on a lower indentation of a mold.

The integrated circuit and the support zone 11 are then overmolded using an epoxy resin in a step E4, with the exception of the two lateral retention members 13, which remain visible (FIG. 2). This first overmolding 20 protects the integrated circuit 15 and in particular the measurement cells 15-1.

The assembly formed by the lead frame 10 and the first overmolding 20 is placed on the lower indentation 31 of a mold 30 (FIG. 3) in a step E5. Metal terminals 12-1, forming extensions of the connection pins 12, are positioned on the free ends of the connection pins 12 in order to allow the subsequent electrical connection of the sensor 1 with the outside, as will be described hereafter. The terminals 12-1 are not soldered at this stage so as to avoid damaging them during the overmolding of step E11 described hereafter.

Figure 4:
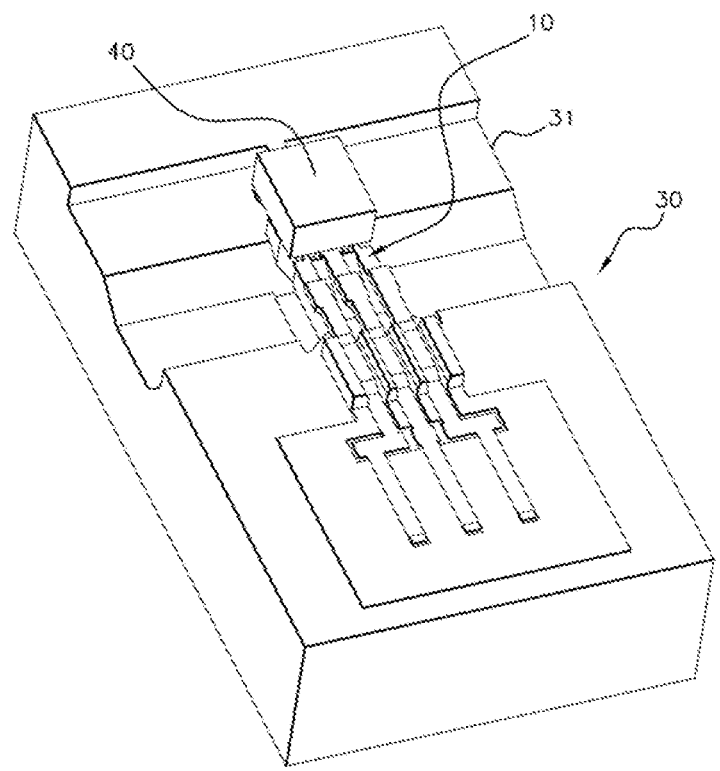
FIG. 4 is a perspective view of the assembly of FIG. 3, in which a magnet has been positioned on the integrated circuit overmolding.

A magnet 40 is positioned on the first overmolding 20 in a step E6 (FIG. 4). In this example, the magnet 40 is parallelepiped shaped but it should be noted that in another embodiment, the magnet 40 could assume a different shape, for example, cylindrical.

Figure 5:
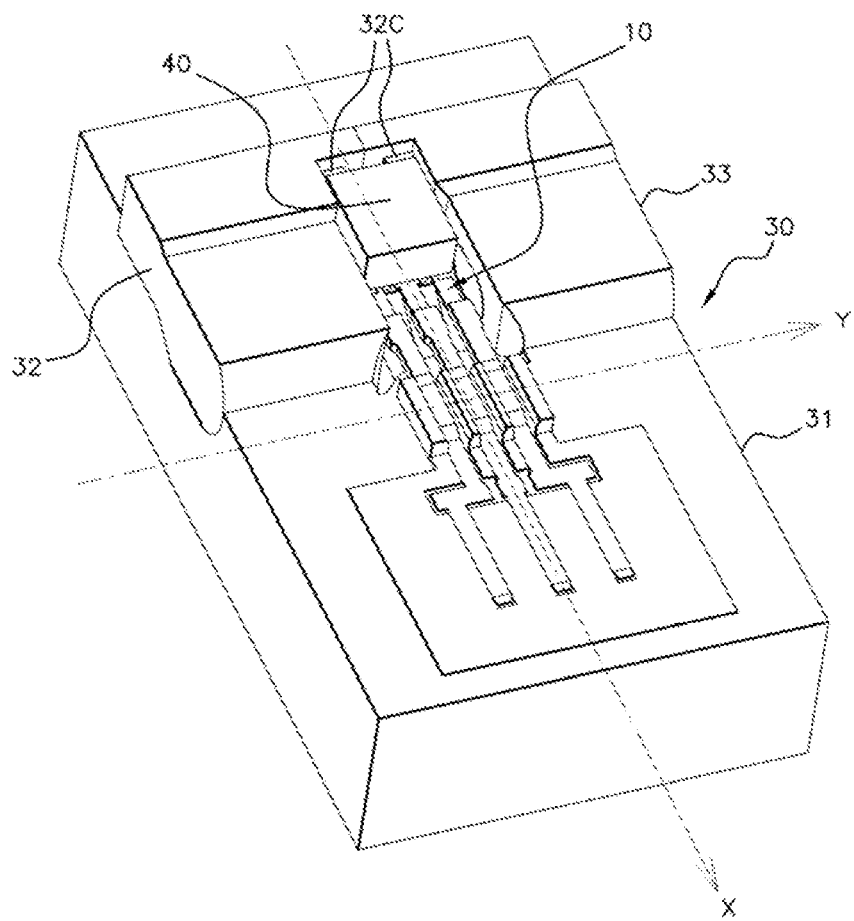
FIG. 5 is a perspective view of the assembly of FIG. 4, in which a left lateral indentation and a right lateral indentation of the mold have been positioned.

A left lateral indentation 32 and a right lateral indentation 33 of the mold 30 are then positioned on the lower indentation 31 so as to retain the magnet on its left part, on its right part and on its rear part in a step E7 (FIG. 5). The left lateral indentation 32 and the right lateral indentation 33 come into contact with the lateral retention members 13 in order to ensure that the lead frame 10 is translationally locked along the transverse axis Y and in contact with the rear part of the magnet 40 via two mold stops 32C, in order to ensure that the magnet is translationally locked along the longitudinal axis X toward the rear.

More specifically, firstly with reference to FIG. 1, each lateral retention member 13 projects from the support zone 11 along the transverse axis Y and comprises a central portion 13A defining two stops at its free end in the form of two rounded corners 13-1. Each lateral retention member 13 also comprises two lugs 13-2.

Figure 6:
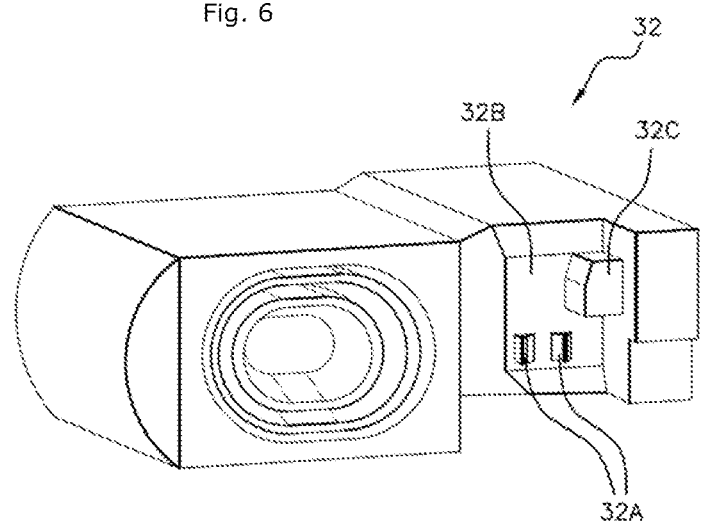
FIG. 6 is a perspective view of the left lateral indentation of the mold, particularly showing the support protrusions for retaining the retention members of the lead frame.

With reference to FIG. 6, the left lateral indentation 32 comprises two prism shaped protrusions 32A with a triangular cross-section vertically formed on the inner wall 32B of said left lateral indentation 32. The structure of the right lateral indentation 33 is symmetrically identical.

The placement of the two lateral mold indentations 32, 33 involves bringing the two protrusions 32A of each lateral mold indentation 32, 33 into contact with the two corners 13-1 of the corresponding lateral retention member 13 and bringing the mold stops 32C into contact so as to effectively retain and translationally lock the lead frame 10 both longitudinally and transversely by bringing (or by interfering) the two protrusions 32A of the lateral indentations 32, 33 into contact with the lateral retention members 13 in the vicinity of the two corners 13-1. The function of the inner wall 32B and of the mold stops 32C is to properly position the magnet 40 with respect to the integrated circuit (pre-centering). To this end, the inner wall 32B and the mold stops 32C are produced on each of the lateral indentations 32, 33 in order to achieve a better relative position by dispensing with the necessary functional clearances compared to the case whereby this relative positioning would be achieved by means of several movable parts in the mold 30.

Figure 7:
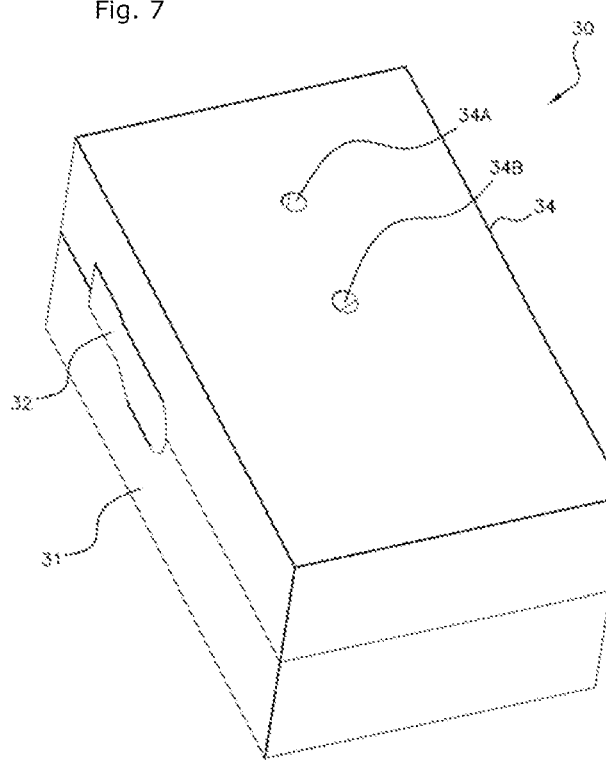
FIG. 7 is a perspective view of the assembly of FIG. 6, in which an upper support of the mold has been positioned.

An upper indentation 34 of the mold 30 is then placed over the lower indentation 31, the left lateral indentation 32 and the right lateral indentation 33 so as to cover the magnet and close the mold 30 in a step E8 (FIG. 7). The upper indentation 34 comprises a first hole 34A and a second hole 34B.

Figure 8:
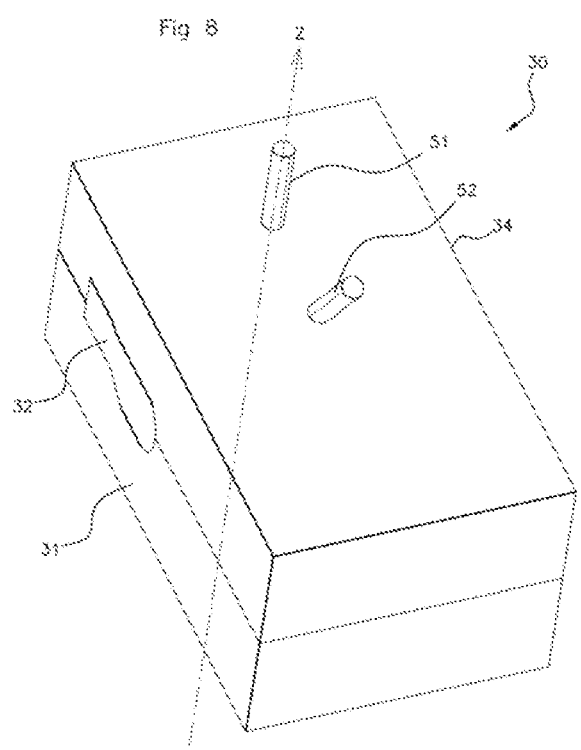
FIG. 8 is a perspective view of the assembly of FIG. 7, in which a vertical pin and an oblique pin have been positioned.

A vertical pin 51 and an oblique pin 52 are then respectively inserted into the first hole 34A and the second hole 34B of the upper indentation 34 in a step E9 in order to respectively translationally lock the magnet along a vertical axis Z and along the longitudinal axis X toward the front (FIG. 8).

Figure 9:
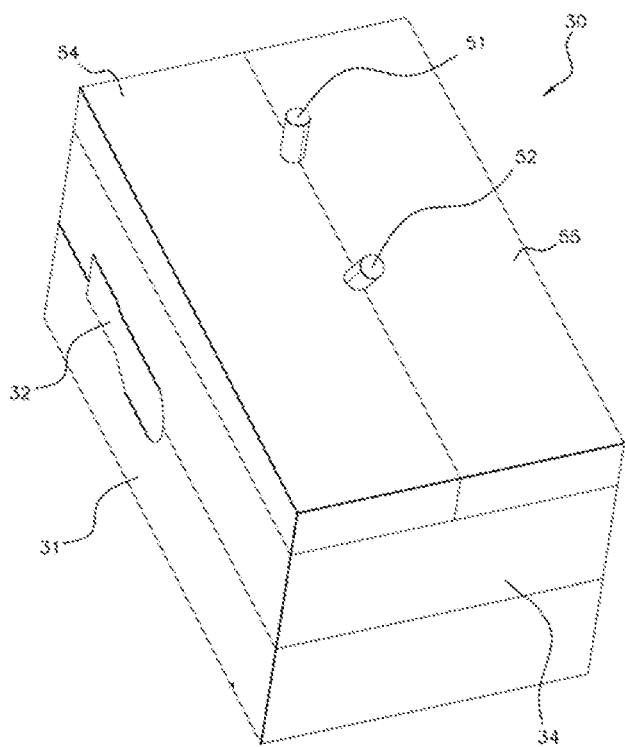
FIG. 9 is a perspective view of the assembly of FIG. 8, in which a left and a right clamp have been placed for locking the pins.

A left clamp 54 and a right clamp 55 are then mounted on the upper indentation 34 of the mold 30 in a step E10 in order to retain the vertical pin 51 and the oblique pin 52 for molding (FIG. 9).

The integrated circuit, the magnet and part of the lead frame are then overmolded in a step E11 using epoxy resin so as to allow the end of the connection pins 12 to project. The magnet 40 and the overmolding of the integrated circuit are then fixed in an intermediate overmolding 61 (shown in FIG. 10) so as to precisely lock them relative to each other to enable high measurement efficiency for the sensor 1. The corners 13-1 are still visible since they are overlaid by the two protrusions 32A of the indentations 32, 33 of the mold 30.

Figure 10:
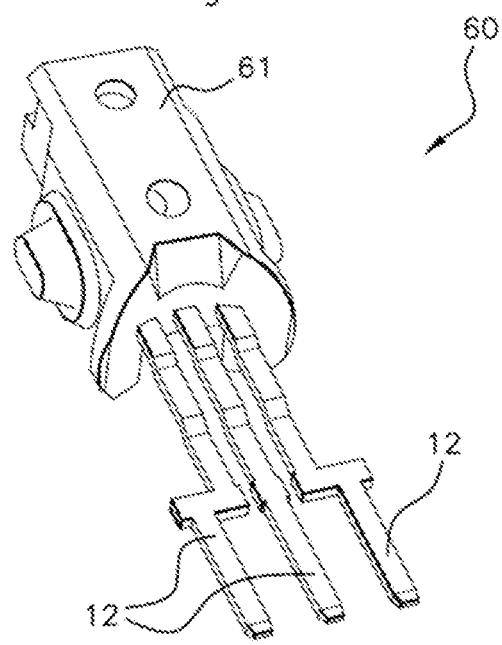
FIG. 10 is a perspective view of an intermediate element obtained after molding in the mold.
Figure 11:
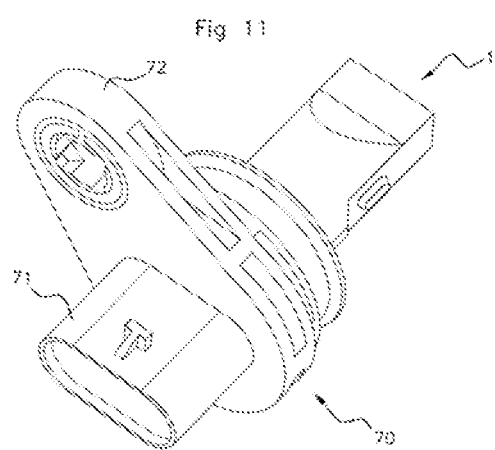
FIG. 11 is a perspective view of an embodiment of the sensor according to the invention, obtained after final overmolding.

The mold 30 is then removed in a step E12 in order to obtain an intermediate element 60 (FIG. 10). The terminals 12-1 then can be soldered onto the connection pins 12 in order to complete the electrical connection and allow the sensor 1 to transmit the signals it measures to an electronic control unit of the vehicle.

Final overmolding 70 of the intermediate element 60 is carried out in another mold (not shown) in a step E13 (FIG. 11), in order to form the sensor 1 and in particular a connector socket 71 around the terminals 12-1, in order to electrically connect the sensor 1 in the vehicle, and a fixing member 72, for example, in the form of a ring, in order to mount the sensor 1 in the vehicle.

The invention claimed is:

1. A method for manufacturing a sensor for a motor vehicle, said method comprising:
    placing a sensor core in a lower indentation of a mold, said sensor core comprising a metal lead frame, comprising a plurality of connection pins and two lateral retention members, and an integrated circuit, comprising at least one measurement cell and being overmolded, in a first overmolding, on a support zone of the metal lead frame so that the lateral retention members and the connection pins are exposed, and an electrically conductive terminal on each connection pin;
    placing a magnet in line with the integrated circuit overmolded on the first overmolding of the previous step;
    placing two lateral indentations of the mold on either side of the magnet and of the integrated circuit so that said lateral indentations hold the lead frame in the vicinity of the lateral retention members by ensuring both longitudinal and transverse translational locking of the lead frame, while forming a space around the integrated circuit and the magnet for an overmolding material;
    overmolding the overmolded integrated circuit, the magnet and part of the lead frame, the magnet and the overmolded integrated circuit then being fixed in an intermediate overmolding so as to precisely lock them relative to each other for the measurement efficiency of the sensor and so as to allow the free end of the terminals to project; and
    removing the mold.

2. The method as claimed in claim 1, wherein the free end of each lateral retention member comprises at least one stop and the lateral indentations each comprise two support protrusions, the placement of the two lateral indentations comprises bringing the at least one stop of the lateral retention member into contact with the protrusions of the corresponding lateral indentation.

3. The method as claimed in claim 1, wherein the placement of the magnet in the lower indentation is carried out so that the magnet comes into abutment against each lateral indentation along the longitudinal axis in the vicinity of mold stops.

4. The method as claimed in claim 1, further comprising a step of placing a pin allowing the magnet to be vertically translationally locked in the mold.

5. The method as claimed in claim 1, further comprising a step of placing a pin allowing the magnet to be longitudinally translationally locked in the mold.

6. The method as claimed in claim 1, further comprising a step of disposing the integrated circuit on the metal lead frame, a step of electrically connecting the integrated circuit with the connection pins and a step of overmolding the integrated circuit and part of the lead frame so as to reveal the lateral retention members and to allow the end of the connection pins to project, with the magnet then being placed on said overmolding of the integrated circuit.

7. The method as claimed in claim 1, comprising a step of final overmolding of the intermediate overmolding of the integrated circuit, the magnet and part of the lead frame so as to form a connector socket around the ends of the terminals.

8. A mold for manufacturing a sensor using the method as claimed in claim 1, said sensor comprising a metal lead frame comprising a plurality of connection pins and two lateral retention members, each lateral retention member comprising a free retention end in the form of a projecting rectangular portion comprising two corners, said mold comprising two lateral indentations each comprising an inner surface designed to retain the lead frame in the vicinity of the free end of the lateral retention members of the lead frame by ensuring longitudinal and transverse translational locking of the lead frame when the mold is closed onto the lead frame.

9. The mold as claimed in claim 8, wherein each lateral indentation comprises at least one stop element of each lateral retention member.

10. A motor vehicle comprising a sensor obtained using the method as claimed in claim 1.

\* \* \* \* \*

UNITED STATES PATENT AND TRADEMARK OFFICE
CERTIFICATE OF CORRECTION

Page 1 of 1

PATENT NO. : 11,898,880 B2
APPLICATION NO. : 17/889874
DATED : February 13, 2024
INVENTOR(S) : Hervé Contet and Martin Throm It is certified that error appears in the above-identified patent and that said Letters Patent is hereby corrected as shown below:

On the Title Page

Please insert:
-- (30) Foreign Application Priority Data
Aug. 18, 2021 (FR) ....... 2108745 --.

Signed and Sealed this
Twenty-third Day of July, 2024

Katherine Kelly Vidal
*Director of the United States Patent and Trademark Office*